(12) United States Patent
Savaria et al.

(10) Patent No.: US 6,858,356 B2
(45) Date of Patent: Feb. 22, 2005

(54) METHOD OF GENERATING LARGE SCALE SIGNAL PATHS IN A PARALLEL PROCESSING SYSTEM

(75) Inventors: Yvon Savaria, Montréal (CA); Meng Lu, Montréal (CA); Claude Thibeault, Brossard (CA)

(73) Assignee: Hyperchip Inc., Montreal (CA)

( * ) Notice: Subject to any disclaimer, the term of this patent is extended or adjusted under 35 U.S.C. 154(b) by 153 days.

(21) Appl. No.: 10/324,110

(22) Filed: Dec. 20, 2002

(65) Prior Publication Data

US 2003/0138705 A1 Jul. 24, 2003

Related U.S. Application Data

(60) Provisional application No. 60/341,236, filed on Dec. 20, 2001.

(51) Int. Cl.[7] .............................. G03F 9/00; G03C 5/00

(52) U.S. Cl. .............................. 430/5; 430/30; 430/311; 430/394; 430/396

(58) Field of Search .............................. 430/5, 311, 30, 430/394, 396, 22; 378/34, 35

(56) References Cited

U.S. PATENT DOCUMENTS 6,015,641 A * 1/2000 Chou .............................. 430/5

* cited by examiner

*Primary Examiner*—Saleha R. Mohamedulla
(74) *Attorney, Agent, or Firm*—Ogilvy Renault

(57) ABSTRACT

A reticle and method simultaneously generate small- and large-scale circuit structures of a parallel processing system. The reticle includes at least two circuit traces having respective contact pads within an overlap zone of the reticle. Connectivity between a circuit trace of one reticle image with a circuit trace of an adjacent reticle image is controlled by varying the degree of overlap between the two images.

12 Claims, 3 Drawing Sheets

METHOD OF GENERATING LARGE SCALE SIGNAL PATHS IN A PARALLEL PROCESSING SYSTEM

CROSS-REFERENCE TO RELATED APPLICATIONS

This is the first application filed for the present invention. This application claims the benefit of Provisional Application No. 60/341,236, filed Dec. 20, 2001.

MICROFICHE APPENDIX

Not Applicable.

TECHNICAL FIELD

The present invention relates to parallel processing systems composed of multiple identical cells, and in particular to methods of generating large scale circuits in such a parallel processing system.

BACKGROUND OF THE INVENTION

Complex electronic systems are typically designed using multiple integrated circuit (IC) packages mounted on a printed circuit board with interconnects between the packages provided by traces on the printed circuit board. This approach to system design is highly versatile, because a designer can develop a wide range of different systems by selecting from a comparatively limited number of standard IC packages having well defined functionality. Isolation and correction of defects is also simplified, because each IC package can be tested individually, and any packages found to be defective can be replaced. In the case of parallel processing systems, this modular design approach is frequently extended by placing each processor element (and its associated interface, memory, and power management devices) on a single printed circuit (PC) board. Several such PC boards are then connected to a communications "backplane" to construct the parallel processing system.

Well known disadvantages of the use of such a modular design approach include the comparatively large physical distances separating each IC of the system (which adversely affects system speed), and increased system noise due, among other things, to Radio Frequency Interference (RFI) and impedance mismatches between "on-chip" circuit traces and the PC board lines between the IC packages. All of these factors negatively impact system performance. Designers have recognized that wafer-scale integration (WSI); that is, the manufacture of entire systems (or major system components) on a single wafer provides an effective means of maximizing system performance by simultaneously addressing both of these limitations.

However, a primary limiting factor in integrated circuit fabrication is that, as the size of an IC increases, so does the probability that manufacturing defects (e.g., a dust particle on the surface of the wafer or physical defects in the wafer) will damage at least part of the circuitry on the wafer. This problem is typically expressed in terms of "yield"; that is, the number of serviceable IC's that can be manufactured from each wafer. With current manufacturing methods using 30 cm diameter wafers (approx. 700 cm2 surface area), the yield for IC's covering about 5 mm2 is close to 100%. By contrast, for IC's of about 5 cm2, the yield can be up to about 80% depending on process maturity. As the size of an IC increases toward the total wafer area, the expected yield drops to close to zero, thereby effectively prohibiting the development of practical systems covering the entire surface of the water.

For the purposes of the present disclosure, a "defect" shall be understood to refer to a physical disturbance or an anomaly that affects a manufactured component. Common sources of defects include dust particles on a wafer surface during manufacture. A "fault" shall be understood to refer to a change or anomaly in the logical behavior of one or more components. In many cases, defects will produce faults, and thus can be inferred from detected anomalous behavior of an IC. However, this is not always the case; some faults are not related to defects, and some defects do not produce faults. An example of the later case in a fault that pinches, but does not sever a wire.

Various techniques are known for producing fault-tolerant IC's. For example, U.S. Pat. No. 4,621,201 to Amdahl et al. teaches a fault-tolerant IC system in which plural copies of each circuit are manufactured on a single wafer. Predetermined circuit element groups of the copies are interconnected, following manufacture, to assemble the working system. According to Amdahl et al., a majority voting scheme is used, which requires at least triple redundancy for each circuit to be protected. Alternatively, fused links can be used to statically remove defective elements from the circuit. This implies having at least a one-for-one redundancy for each circuit to be protected.

Both of these techniques imply a highly inefficient utilization of the surface of the wafer. In particular, the technique of Amdahl et al. results in a utilization efficiency of about 33%, while the use of fused links achieves, at best, a 50% efficiency. Successful implementation of WSI systems requires a fault-tolerant system architecture that remains serviceable in the presence of manufacturing defects, while maximizing utilization efficiency of the wafer surface.

Another difficulty with WSI is the size of the reticle used for generating circuit traces and components on the surface of the wafer. In practice, the largest usable reticle covers an area of about 2 cm×2 cm, so that multiple reticle images must be used to cover the entire wafer. However, the cost of preparing multiple unique reticles for a single wafer is prohibitive. In the case of a parallel processing system, each processor element of the system can be identical, and a reticle image ray cover one or more processor elements. Thus, in principle, a single reticle could be used to generate every processor element. However, the connectivity of each processor element to associated communications busses must necessarily be unique. Development of a cost-effective WSI parallel processing system requires a system architecture in which a single reticle can generate multiple cells of the parallel processing system, each cell having a unique connectivity to a communications bus.

As noted above, defects during manufacture cannot be entirely eliminated. It is therefore essential to be able to determine the operability of each cell (and bus) of a system following manufacture. Traditional techniques, such as functional or "edge connector" tests, and in-circuit or "bed-of-nails" testing are impractical for WSI parallel processing systems. Currently, boundary scan testing is the one of the best practical ways of detecting faults in highly complex digital integrated circuits. Boundary scan testing uses built-in test logic to verify the operation of internal elements (including the absence of manufacturing defects) of complex systems and integrated circuits. The Joint Test Access Croup (JTAG) has developed a boundary scan test implementation that is the only systematic technique that has been standardized for this task, and is sanctioned by the Institute of Electrical and Electronic Engineers (IEEE) under standard 1149.1.

According to the IEEE 1149.1 standard, a standard Test Access Port (TAP) is located "on chip" for testing each IC of the system. Each TAP has a closely similar structure, including Instruction, Bypass, and test data registers, as well as instruction decode logic, output multiplexers and TAP controller logic for controlling operation of the TAP. In a WSI parallel processing system, each cell may include one or more TAPs for testing the cell's processor element and associated circuitry. Every TAP of the system is connected, in series, on a four- or five-wire "scan chain bus" to form one or more continuous "scan chains" spanning the entire system. Each scan chain has an external appearance (that is, from the point of view of external system test logic) of a linear shift register, in which every TAP can be represented by a unique set of addresses. This enables each TAP to be individually accessed to test specific IC's of the system, and test results obtained for analysis. As a result, IEEE 1149.1 provides an efficient system for testing very complex systems, such as WSI parallel processing systems. The individual accessibility provided by IEEE 1149.1 is often used for other tasks such as boot-strapping, debugging and configuring.

However, implementation of a boundary scan system requires that several TAPs be connected, in series, on a common scan chain. In a system architecture that uses a single reticle to image every cell of a parallel processing system, it is desirable to incorporate traces for this scan chain into the common reticle. This means that scan chain bus traces will be identically duplicated in every reticle image. Within a matrix of identical cells on a wafer, this situation is satisfactory, yielding desired scan chain bus lines and connections spanning multiple reticles. However at the edges of the matrix, a different set of connections will normally be desired. In particular, the signal paths will normally need to "wrap" from one row of cells to a next row of cells (rather than continue to a next successive cell along the same row, for example). It would be desirable to use a single reticle to generate both small scale circuit structures (e.g., of each cell) and large scale circuit structures (such as the scan chain) spanning several reticles on a wafer.

Implementation of a scan chain in a WSI system involves generating circuit structures of the scan chain (e.g. TAPs and scan chain busses) on the wafer. As will be appreciated, if a manufacturing defect severs the scan chain, then the entire wafer becomes both untestable and unconfigurable, and must therefore be discarded. A known method of reducing the effect of this vulnerability is to implement parallel redundant scan chains that follow physically diverse paths through the wafer For each IC under test, a pair of TAPs perform a boundary scan, and the results are combined using a voting scheme. The use of physically diverse paths reduces the probability that a single defect will sever both chains. Furthermore, the voting scheme implemented for each pair of TAPs reduces the probability that defects at different locations on the wafer (and affecting both chains) will render the scan chain as a whole inoperative. However, if a manufacturing defect has the effect of disabling both of the TAPs testing an IC, then both of the redundant scan chains will be severed, and the scan chain as a whole will fail. In a multi-cell parallel processing system, this situation may arise, for example, when the manufacturing defect affects a large area (covering most or all of a cell), or affects control (e.g. for power supply or clock signal) lines to a cell.

Accordingly, a system architecture for a wafer-scale parallel processing system that remains serviceable in the presence of manufacturing defects, remains highly desirable.

SUMMARY OF THE INVENTION

An object of the present invention is to provide a technique for simultaneously generating large and small scale circuit structures in a wafer-scale parallel processing system using a single reticle.

Accordingly, an aspect of the present invention provides a reticle for generating large scale circuit structures on a substrate. The reticle comprises at least two circuit traces defining respective alternative portions of the large-scale circuit structure. Each circuit trace has a respective contact pad disposed at a predetermined distance from an edge of the reticle, such that a connectivity between circuit structures generated by a first image of the reticle, and circuit structures generated by a second image of the reticle is determined by a degree of overlap between the first and second images.

A further aspect of the present invention provides a reticle for generating large-scale circuit structures on a substrate. The reticle includes an unconditional circuit trace and an optional circuit trace. The unconditional circuit trace has a respective contact pad proximal an edge of the reticle, such that a respective circuit structure generated by the unconditional circuit trace is connected to a corresponding circuit structure generated by an adjoining reticle image, substantially independently of a degree of overlap between the two reticle images. Conversely, the optional circuit trace has a respective contact pad disposed at a predetermined distance from an edge of the reticle image, such that a connectivity between a respective circuit structure generated by the optional circuit trace and a corresponding circuit structure generated by an adjoining reticle image is dependent on a degree of overlap between the two reticle images.

A still further aspect of the present invention provides a method of generating large scale circuit structures on a substrate. The method includes steps of: providing a reticle comprising at least two circuit traces defining respective alternative portions of the large-scale circuit structure, each circuit trace having a respective contact pad disposed at a predetermined distance from an edge of the reticle; and controlling a connectivity between circuit structures generated by a first image of the reticle and circuit structures generated by a second image of the reticle by varying a degree of overlap between the first and second images.

Each contact pad may be disposed within an overlap zone of the reticle.

The reticle may also include circuit traces defining respective small-scale circuit structures of one or more cells of a parallel processing system. In such cases, each cell is preferably located outside the overlap zone, such that circuit structures of a cell generated by the first reticle image are substantially unaffected by interference with circuit structures of a cell generated by the second reticle image.

At least one circuit trace may be an unconditional circuit trace designed to generate circuit structures in each of the first and second images that are unconditionally connected, independently of a degree of overlap between the two images. In such cases, at least one contact pad of the unconditional circuit trace is oriented substantially orthogonal to the edge of the reticle.

At least one circuit trace may be an optional circuit trace designed to generate circuit structures in each of the first and second images that may be either connected or unconnected, based on the degree of overlap between the two images. Each optional circuit trace may include at least one contact pad oriented substantially parallel to the edge of the reticle.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The present invention provides a method and system for simultaneously generating large and small scale circuit structures in a water-scale parallel processing system using a single reticle. For the purposes of the present invention, a "small scale" circuit structure shall be understood to refer to any pattern of circuit traces that repeats on a scale of one reticle, or less. Conversely, a "large scale" circuit structure shall be understood to refer to any pattern of circuit traces that repeats on a scale of more than one reticle. A typical example of a large-scale circuit structure is a scan chain, which links every processing element of the parallel processing system in a continuous "daisy chain".

Figure 1:
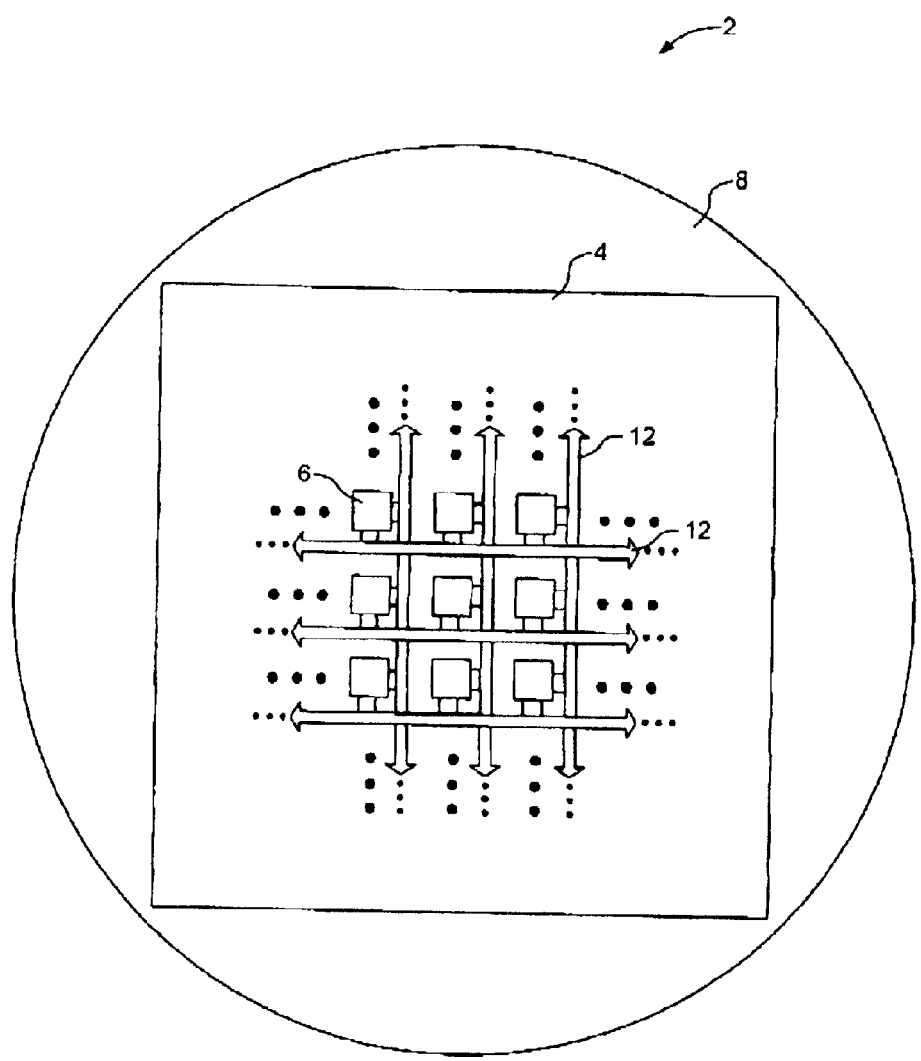
FIG. 1 is a schematic illustration of a parallel processing system arranged on the surface of a substrate, in accordance with an embodiment of the present invention.

FIG. 1 schematically illustrates principle features of an exemplary wafer-scale parallel processing system in which the present invention may be deployed. As shown in FIG. 1, the wafer-scale parallel processing system 2 generally comprises a rectangular (other shapes are possible) matrix 4 of cells 6 disposed on a wafer 8 (or, more broadly, a substrate 8). Each cell 6 is substantially identical, and encompasses a respective processor element 10 (FIG. 2) and associated circuit elements (not shown). A mesh of communications busses 12 link the cells 6 and carry data signals between cells 6 within the matrix 4, and between the matrix 4 and external devices (not shown). Each communications bus 12 is associated with a respective set (i.e. a row or a column) of cells 6, and includes a respective access point (not shown) associated with each cell 6 to facilitate bus access by the respective cell 6.

As mentioned previously, it is preferable to use a single reticle (encompassing one or more cells, access points, and respective portions of associated communications busses) repeatedly to generate the entire matrix 4. This means that an identical pattern of circuit traces will be generated within each reticle. Designing circuit traces on a "per-reticle" basis allows the reticle to be repeated (in principle, infinitely) to construct a massively parallel processing system of any arbitrary size (constrained primarily by the size of the reticle image on the substrate 8 and the dimensions of the substrate itself). However, this means that the pattern of circuit traces of the reticle is repeated identically throughout the matrix. The present invention enables a single reticle to be used repeatedly to simultaneously generate both small- and large-scale circuit structures of the parallel processing system.

Figure 2:
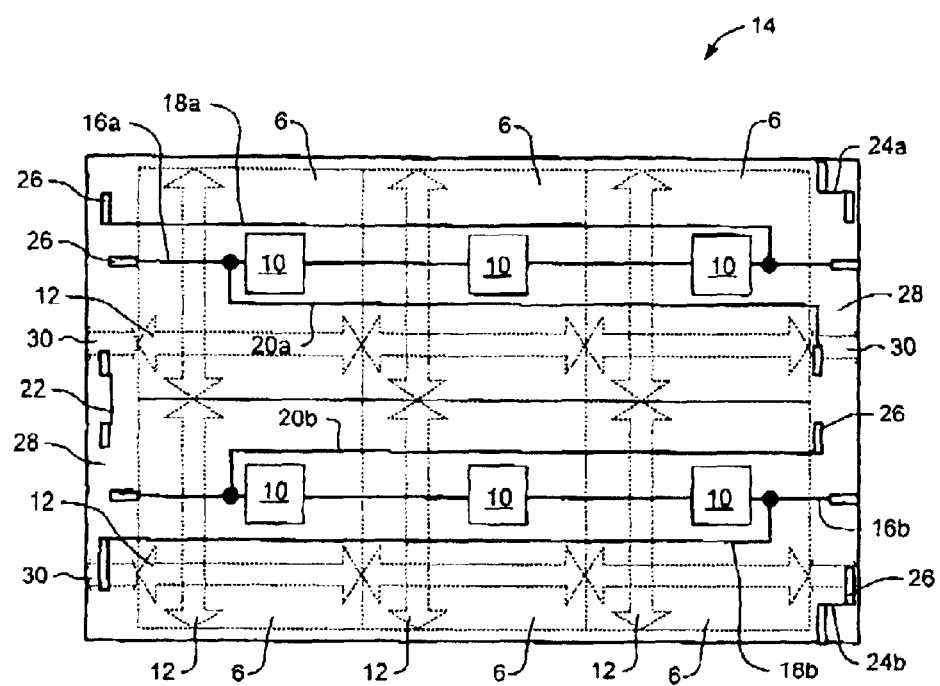
FIG. 2 is a schematic illustration showing exemplary signal paths of a multi-cell reticle for generating large scale circuits, in accordance with an embodiment of the present invention.

For the purposes of description, the present invention will be described using a single scan chain spanning the entire cell matrix 4. It will be appreciated, however, that multiple scan chains, each spanning a respective portion of the matrix 4, may be used if desired. As is known in the art, a typical scan chain (for example, in accordance with a Joint Test Action Group standard) requires that every cell 6 of the matrix 4 be connected together in series along a single "daisy chain". It is comparatively easy to define appropriate circuit traces within each cell 6 such that all the cells of a single row (or column) of the matrix will be coupled together in series. However, at the extreme ends of the row (or column) additional circuit traces are required in order to link one row to the next. As such, the scan chain represents a large scale structure which repeats every two rows. FIG. 2 schematically illustrates principle features of a reticle in accordance with an exemplary embodiment of the present invention.

As shown in FIG. 2, the reticle 14 encompasses a block of six (substantially identical) cells 6 lying within two successive rows of the cell matrix 4. It will be appreciated, however, that the reticle 14 could be designed to encompass as few as one cell 6, or very much more than six cells 4, if desired. Similarly, the cells 6 encompassed by the reticle 14 may be distributed over any desired number of rows. Thus it will be seen that the embodiment illustrated in FIG. 2 is in no way limitative of the present invention.

As shown by fine dashed lines in FIG. 2, the reticle 14 provides a complete set of circuit traces for defining the small scale circuit structures of the matrix 4, which repeat identically in each cell 6 (and/or in each image of the reticle). These may include, for example, a respective portion of communications busses 12 associated with each cell, a processor element 10 within the cell 6 and any necessary interconnections (not shown) between the communications busses 12 and the processor elements 10. Other small scale structures defined within the reticle 14 may include circuit traces (not shown) enabling data signals to be transferred between adjacent cells 6, if desired. In addition to the small scale structures, the reticle also includes a set of circuit traces for defining the large-scale circuit structures of the scan chain.

As shown by the solid lines in FIG. 2, the circuit traces of the scan chain includes a trunk line 16 connecting each of the processor units 10 within each row, a respective pair of branch lines 18 and 20 coupled to each of the trunks 16, and a set of connector lines 22 and 24. Each of these lines 16–24 includes a respective contact pad 26 located within an overlap zone 28 of the reticle 14. This overlap zone 28 nominally lies outside of each of the cells 6, so that circuit traces of one reticle image will not be obliterated by circuit traces of an overlapping reticle image. If required, "carry-through" traces 30 can be used within the overlap zone 28 to allow signal traces of corresponding cells in adjacent reticle images to be properly connected, thereby permitting data signals to be exchanged between cells of adjacent reticle images. In the embodiment of FIG. 2, the overlap zone 28 is substantially wider at the ends of the reticle 14, than along its sides. This is due to the fact that, in the illustrated embodiment, the necessary circuit traces for the scan chain can be accomplished using the illustrated trunk, branch and connector lines 16–24, and by varying only the degree of overlap in the longitudinal direction. In this case, the overlap zone 28 along each side of the reticle 14 can be eliminated altogether, if desired. It will be appreciated, however, that the method of the present invention can equally applied in both orthogonal directions (either alone or in combination), by arranging suitable contact pads 26 within an overlap zone 28 having an appropriate depth.

As may be seen in FIG. 2, the respective contact pads 26 of each of the two trunk lines 16 are oriented longitudinally (relative to each row). As a result, the respective trunk lines 16 of each adjacent reticle image will be connected to form continuous trunk lines spanning the full length of each row of the cell matrix 4, independently of a degree of overlap between adjacent reticles 14. On the other hand, each of the branch and connector lines 18–24 have one or more termination pads oriented orthogonally (again relative to each row) and positioned at respective predetermined distances from the edge of the reticle 14. As a result, connectivity between the branch and connector lines 18–24 of one reticle image and corresponding branch and connector lines 18–24 of an adjacent reticle image will be determined by the degree of overlap of the involved reticle images. Consequently, the formation of circuit traces linking the trunk lines 16 of successive rows can be accomplished by controlling the degree of overlap between the reticle image forming an extreme end of a row, and its neighboring reticle image. The use of variable reticle overlap to construct the scan chain is illustrated in FIG. 3.

Figure 3:
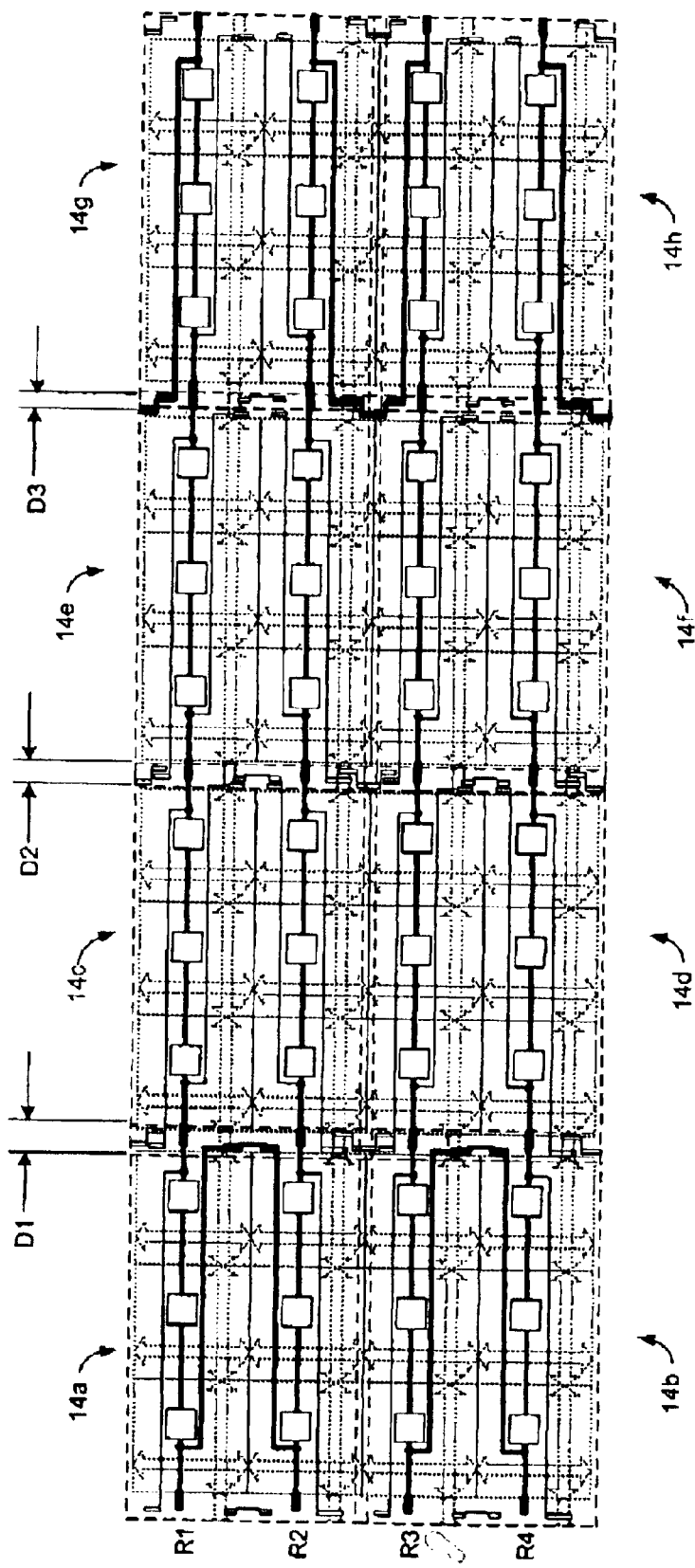
FIG. 3 schematically illustrates a large-scale circuit generated using the reticle of FIG. 2.

As shown in FIG. 3, the reticle 14 of FIG. 2 may be used repeatedly to produce a cell matrix 4 of a desired size. In the embodiment of FIG. 3, a group of eight reticles 14 are shown encompassing four rows of a cell matrix 4 having twelve columns 12. Clearly, a larger cell matrix 4 may be generated by using additional reticle images. In the embodiment of FIG. 3, reticles 14a and 14b define the extreme left end of each row, while reticles 14g and 14h form the extreme right end of each row. The central portion of each row is provided by reticles 14c–f. As may be seen in FIG. 3, the trunk lines 16 of adjoining reticles 14 link together to daisy chain all of the processor elements 10 within each row. Comparing the degree of overlap between successive reticle images, it will be seen that there is a maximum degree of overlap (D1) between left end reticles 14a,b and central reticles 14c,d at the left end of each row; a moderate degree of overlap (D2) between reticles 14c,d and 14e,f forming the central portion of each row; and a minimum amount of overlap (D3) between reticles 14e,f and 14g,h forming the right end of each row. As a result of these different degrees of overlap, branch lines 20a,b in each of reticles 14a,b link with connector line 22 in each of reticles 14c,d to form a continuous circuit trace linking the trunk lines 16 of row R1 to row R2, and linking row R3 to Row R4. At the opposite end of each row, the minimum overlap (D3) results in branch lines 18a,b of each of reticles 14g,h being coupled to connector lines 24a,b in each of reticles 14e,f which produces a continuous circuit trace linking the trunk lines 16 of rows R2 and R3. Within the central portion of each row, the moderate degree of overlap (D2) between adjacent reticles prevents any connection between the branch lines 18–20 of one reticle 14 and the connector lines 22–24 of an adjacent reticle 14. As a result, none of the branch lines within any of these central reticle images carry data traffic, and thus all scan chain signals travel from processor element 10 to processor element 10 along the trunk lines 16 of the row to provide the required functionality of the scan chain. The resulting continuous "daisy chain" spanning the entire cell matrix is shown by the bold lines in FIG. 3.

Thus it will be seen that the present invention provides a reticle and method for simultaneously generating small- and large-scale circuit structures of a parallel processing system. The reticle includes at least two circuit traces having respective contact pads within an overlap zone of the reticle. Connectivity between a circuit trace of one reticle image with a circuit trace of an adjacent reticle image is controlled by varying the degree of overlap between the two images.

The embodiments of the invention illustrated herein are in the context of a wafer-scale parallel-processing system. A person skilled in the art will readily understand that the invention can be equally practiced with other suitable substrates, and on any desired scale.

The embodiment(s) of the invention described above is (are) intended to be exemplary only. The scope of the invention is therefore intended to be limited solely by the scope of the appended claims.

We claim:

1. A reticle for generating large scale circuit structures on a substrate, the reticle comprising at least two circuit traces defining respective alternative portions of the large-scale circuit structure, each circuit trace having a respective contact pad disposed at a predetermined distance from an edge of the reticle, such that a connectivity between circuit structures generated by a first image of the reticle and circuit structures generated by a second image of the reticle is determined by a degree of overlap between the first and second images.

2. A reticle as claimed in claim 1, wherein each contact pad is disposed within an overlap zone of the reticle.

3. A reticle as claimed in claim 2, wherein the reticle further comprises circuit traces defining respective small-scale circuit structures of one or more cells of a parallel processing system, each cell being located outside the overlap zone, such that circuit structures of a cell generated by the first reticle image are substantially unaffected by interference with circuit structures of a cell generated by the second reticle image.

4. A reticle as claimed in claim 1, wherein at least one circuit trace is an unconditional circuit trace adapted to generate circuit structures in each of the first and second images that are unconditionally connected, independently of a degree of overlap between the two images.

5. A reticle as claimed in claim 4, wherein at least one contact pad of the unconditional circuit trace is oriented substantially orthogonal to the edge of the reticle.

6. A reticle as claimed in claim 1, wherein at least one circuit trace is an optional circuit trace adapted to generate circuit structures in each of the first and second images that may be either connected or unconnected, based on the degree of overlap between the two images.

7. A reticle as claimed in claim 6, wherein at least one contact pad of the optional circuit trace is oriented substantially parallel to the edge of the reticle.

8. A reticle for generating large-scale circuit structures on a substrate, the reticle comprising:
 an unconditional circuit trace having a respective contact pad proximal an edge of the reticle, such that a respective circuit structure generated by the unconditional circuit trace is connected to a corresponding circuit structure generated by an adjoining reticle image, substantially independently of a degree of overlap between the two reticle images; and
 an optional circuit trace having a respective contact pad disposed at a predetermined distance from an edge of the reticle image, such that a connectivity between a respective circuit structure generated by the optional circuit trace and a corresponding circuit structure generated by an adjoining reticle image is dependent on a degree of overlap between the two reticle images.

9. A reticle as claimed in claim 8, wherein the contact pad of the unconditional circuit trace is oriented substantially orthogonal to the edge of the reticle.

10. A reticle as claimed in claim 8, wherein the contact pad of the optional circuit trace is oriented substantially parallel to the edge of the reticle.

11. A method of generating large scale circuit structures on a substrate, the method comprising steps of:
 providing a reticle comprising at least two circuit traces defining respective alternative portions of the large-scale circuit structure, each circuit trace having a respective contact pad disposed at a predetermined distance from an edge of the reticle; and controlling a connectivity between circuit structures generated by a first image of the reticle and circuit structures generated by a second image of the reticle by varying a degree of overlap between the first and second images.

12. A method as claimed in claim 11, wherein the step of controlling the connectivity between circuit structures generated by the first and second reticle images comprises a step of setting the degree of overlap to a selected one of:

a first overlap in which respective first circuit structures generated by each of the first and second images are connected;

a second overlap in which respective second circuit structures generated by each of the first and second images are connected; and a third overlap in which neither of the first and second circuit structures are connected.

* * * * *